United States Patent
Wang

(10) Patent No.: US 10,728,462 B2
(45) Date of Patent: Jul. 28, 2020

(54) IMAGE SENSOR, IMAGE SENSING SYSTEM, IMAGE SENSING METHOD AND MATERIAL RECOGNITION SYSTEM

(71) Applicant: PixArt Imaging Inc., Hsin-Chu (TW)

(72) Inventor: Guo-Zhen Wang, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 60 days.

(21) Appl. No.: 16/153,842

(22) Filed: Oct. 8, 2018

(65) Prior Publication Data

US 2020/0112663 A1 Apr. 9, 2020

(51) Int. Cl.
- *H04N 5/235* (2006.01)
- *H04N 5/225* (2006.01)
- *G01N 23/04* (2018.01)
- *H01L 27/146* (2006.01)

(52) U.S. Cl.
CPC .......... *H04N 5/2352* (2013.01); *G01N 23/04* (2013.01); *H01L 27/14601* (2013.01); *H04N 5/2251* (2013.01)

(58) Field of Classification Search
CPC .... H04N 5/2352; H04N 5/2251; G01N 23/04; H01L 27/14601
See application file for complete search history.

(56) References Cited

U.S. PATENT DOCUMENTS

| 2003/0169354 A1* | 9/2003 | Aotsuka | H04N 5/335 348/272 |
| 2012/0008030 A1* | 1/2012 | Kono | H04N 5/32 348/301 |
| 2014/0320695 A1* | 10/2014 | Ozawa | H04N 5/35563 348/229.1 |
| 2016/0254300 A1* | 9/2016 | Wajs | H01L 27/14607 257/435 |

* cited by examiner

*Primary Examiner* — Lin Ye
*Assistant Examiner* — Tuan H Le
(74) *Attorney, Agent, or Firm* — Winston Hsu

(57) ABSTRACT

An image sensor, comprising: a first sensing region having a first size, configured to sense first kind of light having a first range of wavelengths; and a second sensing region having a second size, configured to sense second kind of light having a second range of wavelengths, wherein the first size and the second size are different, wherein at least portion of the first range of wavelengths and at least portion of the second range of wavelengths are different. The image sensor has a first light sensitivity level for sensing the first kind of light and has a second light sensitivity level for sensing the second kind of light, and a relation between the first size and the second size corresponds to a relation between the first light sensitivity level and the second light sensitivity level.

4 Claims, 5 Drawing Sheets

IMAGE SENSOR, IMAGE SENSING SYSTEM, IMAGE SENSING METHOD AND MATERIAL RECOGNITION SYSTEM

BACKGROUND OF THE INVENTION

1. Field of the Invention

The present invention relates to an image sensor, an image sensing system, an image sensing method and a material recognition system, and particularly relates to an image sensor, an image sensing system, an image sensing method and a material recognition system can avoid a conventional sensing saturate issue.

2. Description of the Prior Art

Conventionally, an image sensor may have different light sensitivity levels (or named responses) for different kinds of light. That is, even if the image sensor receives different kinds of light with the same light amount, the image sensor may generate different numbers of sensing units (e.g. sensing electrons). For example, R pixels in the image sensor receives red light to generate sensing units, and B pixels in the image sensor receives blue light to generate sensing units as well. However, the sensing units for the red light and the sensing units for the blue light may be different even if the red light and the blue light have the same light amount. Such issue may affect the accuracy for sensing images, since the sensing regions with a high sensitivity level may easily saturate (i.e. the number of the sensing units reaches a max threshold). Such issue is named a sensing saturate issue.

SUMMARY OF THE INVENTION

Therefore, one objective of the present invention is to provide an image sensor to avoid the conventional sensing saturate issue.

Another objective of the present invention is to provide an image sensor to avoid causing extra cost and increases the total volume of the image sensing apparatus.

One embodiment of the present invention discloses: an image sensor, comprising: a first sensing region having a first size, configured to sense first kind of light having a first range of wavelengths; and a second sensing region having a second size, configured to sense second kind of light having a second range of wavelengths, wherein the first size and the second size are different, wherein at least portion of the first range of wavelengths and at least portion of the second range of wavelengths are different. The image sensor has a first light sensitivity level for sensing the first kind of light and has a second light sensitivity level for sensing the second kind of light, and a relation between the first size and the second size corresponds to a relation between the first light sensitivity level and the second light sensitivity level.

Another embodiment of the present invention discloses an image system comprising an image sensor and an amplify circuit. The image sensor comprises: a first sensing region, configured to sense first kind of light having a first range of wavelengths, and configured to generate first sensing units based on the first kind of light; and second sensing region, configured to sense second kind of light having a second range of wavelengths, and configured to generate second sensing units based on the second kind of light, wherein at least portion of the first range of wavelengths and at least portion of the second range of wavelengths are different. The amplify circuit, configured to apply a first gain value to amplify a first sensing signal formed by the first sensing units, and configured to apply a second gain value to amplify a second sensing signal formed by the second sensing units, wherein the first gain value and the second gain value are different. The image sensor has a first light sensitivity level for sensing the first kind of light and has a second light sensitivity level for sensing the second kind of light, and a relation between the first gain value and the second gain value corresponds to a relation between the first light sensitivity level and the second light sensitivity level.

A corresponding image sensing method is also disclosed, but is omitted for brevity here.

The above-mentioned image sensor can applied to a material recognition system. The material recognition system comprises a processing circuit configured to determine a material type of the target material according to the sensing signal from the image sensor.

In view above-mentioned embodiments, the light amount for the light received by different sensing regions of the image sensor can be controlled.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. Please note, each component in each embodiment can be implemented by hardware (a circuit, a device or a system), or can be implemented by hardware with software (ex. a processor installed with at least one program).

Figure 1:
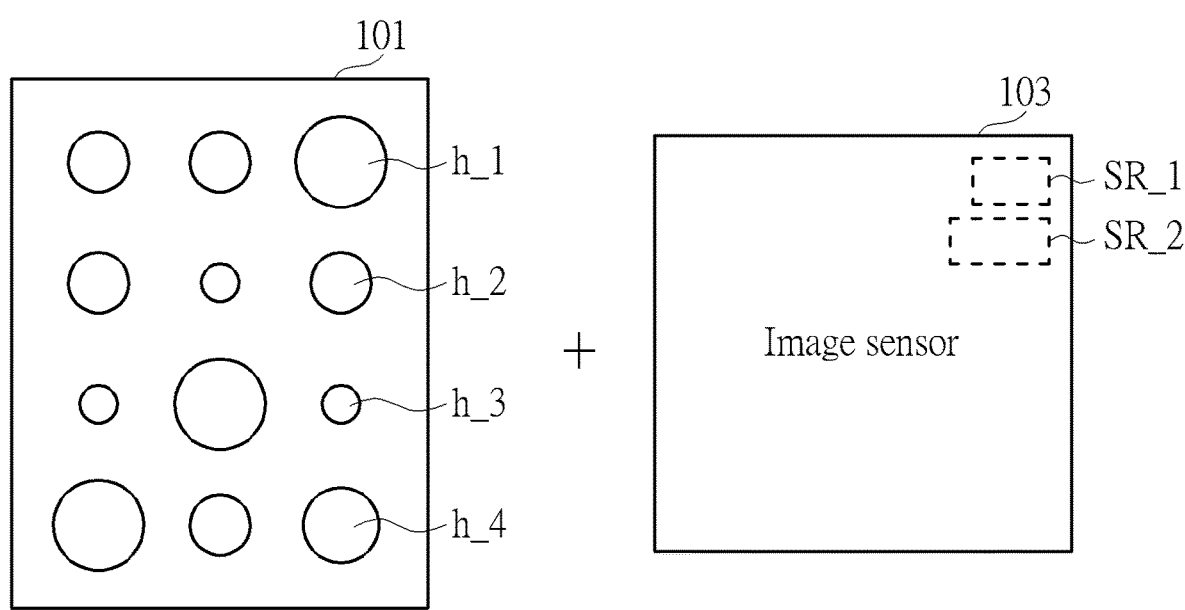
FIG. 1 is a schematic diagram illustrating an image sensor according to one embodiment of the present invention.

FIG. 1 is a schematic diagram illustrating an image sensor according to one embodiment of the present invention. As illustrated in FIG. 1, a cover 101 is provided above the image sensor 103. The cover 101 comprises a plurality of holes h_1-h_4 with different sizes. The holes are configured to expose different sensing regions.

In one embodiment, the image sensor 103 comprises a first sensing region SR_1 having a first size, and a second sensing region SR_2 having a second size different from the first sensing region SR_1. The first sensing region SR_1 and the second sensing region SR_2 respectively comprises at least one pixel. The hole h_1 is configured to expose the first sensing region SR_1, and the hole h_2 is configured to expose the second sensing region SR_2.

If the hole is larger, the corresponding sensing region of the image sensor 103 can easily sense light with a larger light amount. On the opposite, if the hole is smaller, the corresponding sensing region of the image sensor hardly senses light with a large light amount. Via the holes h_1-h_4, different sensing regions of the image sensor 103 can sense light with different light amounts when light with the same illuminance is emitted to the image sensor 103.

Figure 2:
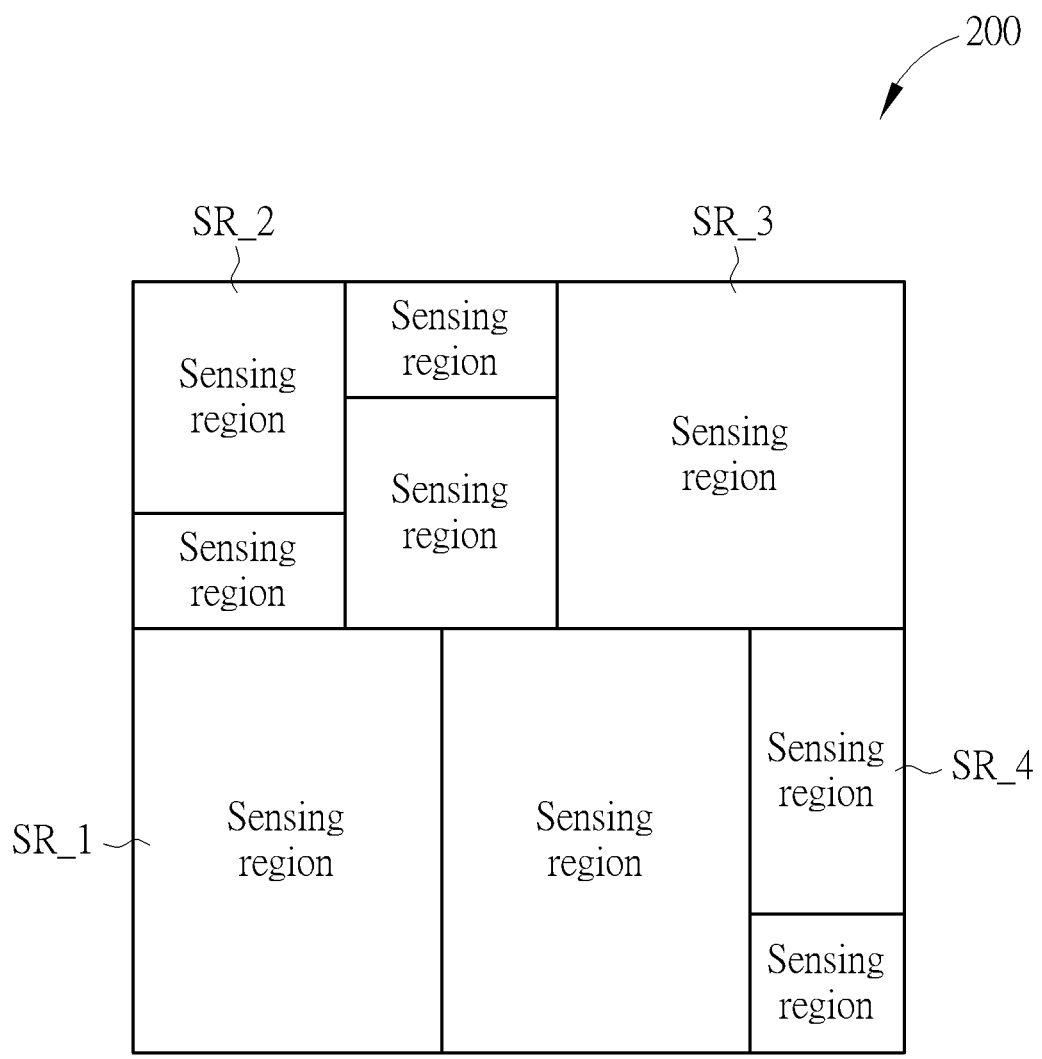
FIG. 2 is a schematic diagram illustrating an image sensor according to another embodiment of the present invention.

FIG. 2 is a schematic diagram illustrating an image sensor according to one embodiment of the present invention. As illustrated in FIG. 2, the image sensor 200 comprises a plurality of sensing regions SR_1, SR_2, SR_3 and SR_4. Each sensing region can have one or more pixels. Please note, only four of the sensing regions SR_1, SR_2, SR_3 and SR_4 are marked, and only two sensing regions SR_1, SR_2 are taken for example to explain this embodiment. For the convenience of explaining, the sensing region SR_1 is named the first sensing region SR_1 and the sensing region SR_2 is named the second sensing region SR_2 herein after.

As illustrated in FIG. 2, the first sensing region SR_1 has a first size and is configured to sense first kind of light having a first range of wavelengths. Also, the second sensing region SR_2 has a second size and is configured to sense second kind of light having a second range of wavelengths. The first size and the second size are different. The sensing regions of the image sensor 200 can be formed by various methods. For example, a color filter can be provided above the image sensor 200 to define the sensing regions.

In one embodiment, only a portion of the first wavelength range and the second wavelength range are different. For example, the first kind of light is purple light with a wavelength 380-450 nm, and the second kind of light is blue light with a wavelength 450-475 nm. In another embodiment, the first range of wavelengths and the second range of wavelengths are completely different. For example, the first kind of light is cyan-blue light with a wavelength 476-495 nm, and the second kind of light is yellow light with a wavelength 570-590 nm.

The sizes of the sensing regions can be changed corresponding to the light sensitivity level of the image sensor 200. For example, in one embodiment, the image sensor 200 has a first light sensitivity level for sensing the first kind of light and has a second light sensitivity level for sensing the second kind of light, and the first light sensitivity level is lower than the second light sensitivity level. That is, when the first kind of light and the second kind of light have the same light amount, the number of sensing units generated by the pixel receiving the first kind of light is smaller than the number of sensing units generated by the pixel receiving the second kind of light (e.g. fewer sensing electrons).

Therefore, a first size of the first sensing region SR_1 is larger than a second size of the second sensing region SR_2, which means a pixel number of the first sensing region SR_1 is larger than a pixel number of the second sensing region SR_2. On the opposite, if the first light sensitivity level is higher than the second light sensitivity level, a first size of the first sensing region SR_1 is smaller than a second size of the second sensing region SR_2. By this way, the speed for generating sensing units of the second kind of light can be decreased, thereby the above-mentioned sensing saturate issue can be avoided. Sizes of other sensing regions of the image sensor 200 can be decided in the same way.

Figure 3:
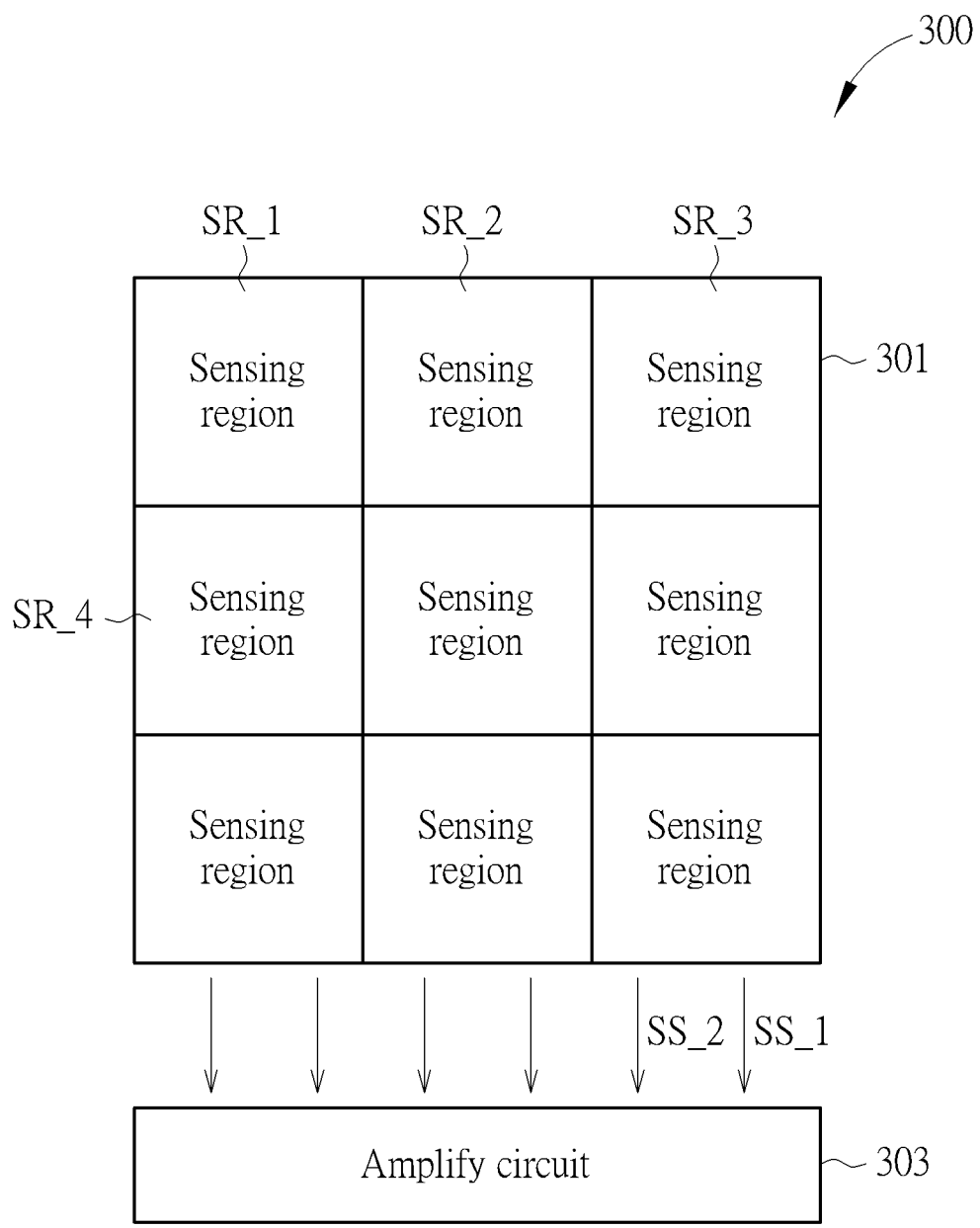
FIG. 3 is a schematic diagram illustrating an image sensing system according to another embodiment of the present invention.

FIG. 3 is a schematic diagram illustrating an image sensing system according to another embodiment of the present invention. As illustrated in FIG. 3, the image sensing system 300 comprises a plurality of sensing regions SR_1-SR_4. Each sensing region can have one or more pixels. The sensing regions of the image sensor 301 can be formed by various methods. For example, a color filter can be provided above the image sensor 301 to define the sensing regions. Please note, only four of the sensing regions SR_1, SR_2, SR_3 and SR_4 are marked, and only two sensing regions SR_1, SR_2 are taken for example to explain this embodiment. For the convenience of explaining, the sensing region SR_1 is named the first sensing region SR_1 and the sensing region SR_2 is named the second sensing region SR_2 herein after.

The first sensing region SR_1 is configured to sense first kind of light having a first range of wavelengths, and configured to generate first sensing units based on the first kind of light. The second sensing region SR_2 is configured to sense second kind of light having a second range of wavelengths, and configured to generate second sensing units based on the second kind of light. In one embodiment, the first sensing units and the second sensing units are both electrons, thus can respectively form sensing signals SS_1 and SS_2.

The amplify circuit 303 is configured to apply a first gain value to amplify the first sensing signal SS_1, and configured to apply a second gain value to amplify the second sensing signal SS_2. The first gain value and the second gain value are different In one embodiment, only a portion of the first wavelength range and the second wavelength range are different. For example, the first kind of light is purple light with a wavelength 380-450 nm, and the second kind of light is blue light with a wavelength 450-475 nm. In another embodiment, the first range of wavelengths and the second range of wavelengths are completely different. For example, the first kind of light is cyan-blue light with a wavelength 476-495 nm, and the second kind of light is yellow light with a wavelength 570-590 nm.

The first gain value and the second gain value can be changed corresponding to the light sensitivity level of the image sensor 301. For example, in one embodiment the image sensor 301 has a first light sensitivity level for sensing the first kind of light and has a second light sensitivity level for sensing the second kind of light, and the first light sensitivity level is lower than the second light sensitivity level. That is, when the first kind of light and the second kind of light have the same light amount, the number of the first sensing units generated by pixels in the first sensing region SR_1 is lower than the number of the second sensing units generated by pixels in the second sensing region SR_2 (e.g. fewer sensing electrons).

Therefore, in such example, the first gain value is larger than the second gain value. On the opposite, if the first light sensitivity level is higher than the second light sensitivity level, the first gain value is smaller than the second gain value. By this way, the amplifying for second sensing units of the second kind of light can be suppressed, to avoid the above-mentioned saturate issue. The gain values for other sensing regions can be decided in the same way.

In one embodiment, the amplify circuit 303 is an ADC (analog to digital converter), thus the above-mentioned gain values mean the gain for amplifying the digital signals of the sensing units from the image sensor 301. Also, in one embodiment, the amplify circuit 303 is provided in a reading circuit for reading the sensing units from the image sensor 301.

In the embodiment of FIG. 3, the sizes of the sensing regions are the same. However, the embodiment of FIG. 2 can be combined to the embodiment of FIG. 3. Accordingly, the sizes of the sensing regions in the embodiment of FIG. 3 can be different and can be decided based on the light sensitivity levels for different kinds of light.

Figure 4:
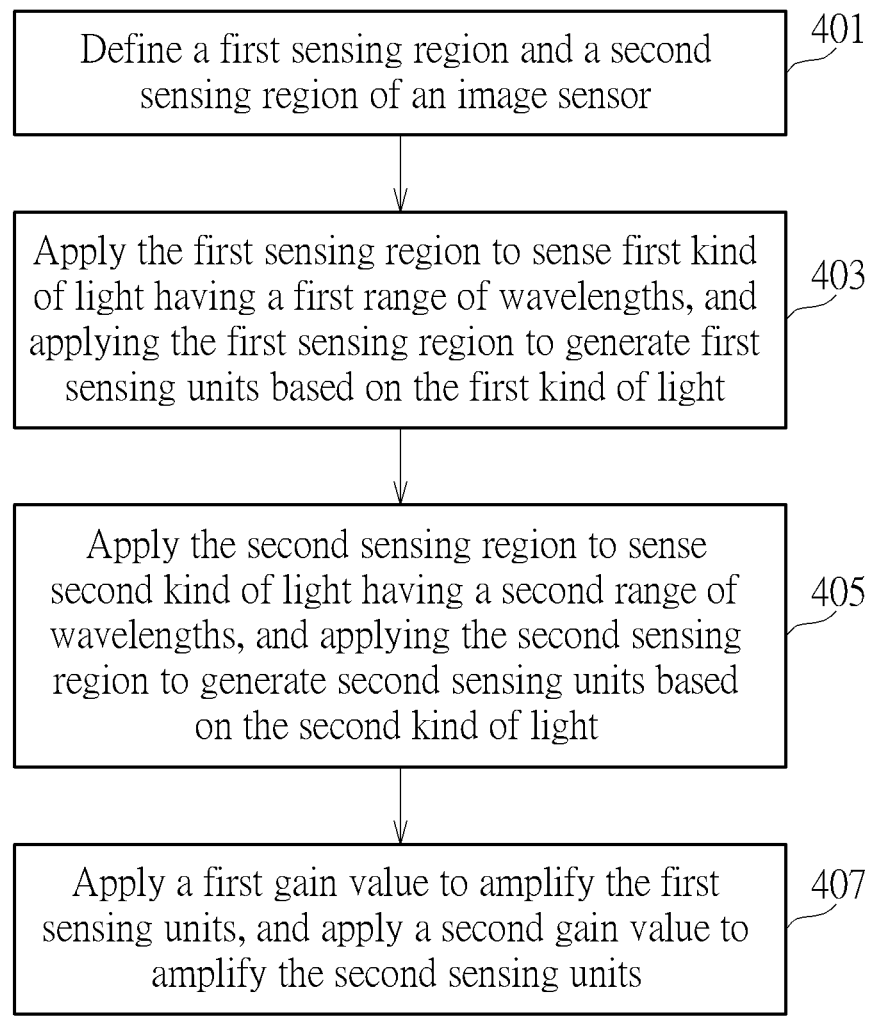
FIG. 4 is a flow chart illustrating an image sensing method according to one embodiment of the present invention.

In view of the embodiment illustrated in FIG. 3, an image sensing method can be acquired, which comprises the steps illustrated in FIG. 4:

Step 401

Define a first sensing region and a second sensing region of an image sensor, for example, the first sensing region SR_1 and the second sensing region SR_2 illustrated in FIG. 3.

Step 403

Apply the first sensing region to sense first kind of light having a first range of wavelengths (e.g. red light), and applying the first sensing region to generate first sensing units based on the first kind of light.

Step 405

Apply the second sensing region to sense second kind of light having a second range of wavelengths (e.g. green light), and applying the second sensing region to generate second sensing units based on the second kind of light. At least portion of the first range of wavelengths and at least portion of the second range of wavelengths are different.

Step 407

Apply a first gain value to amplify the first sensing units, and apply a second gain value to amplify the second sensing units, wherein the first gain value and the second gain value are different.

The image sensor has a first light sensitivity level for sensing the first kind of light and has a second light sensitivity level for sensing the second kind of light, and a relation between the first gain value and the second gain value corresponds to a relation between the first light sensitivity level and the second light sensitivity level.

Other detail steps can be acquired based on the illustration for FIG. 3, thus are omitted for brevity here.

The above-mentioned sensing units generated by the image sensor can be applied for any application. For example, the sensing units can be applied to an optical navigation device, an optical touch control device, an optical pointing device, or any other application. In one embodiment, the sensing units can be applied to recognize materials.

Figure 5:
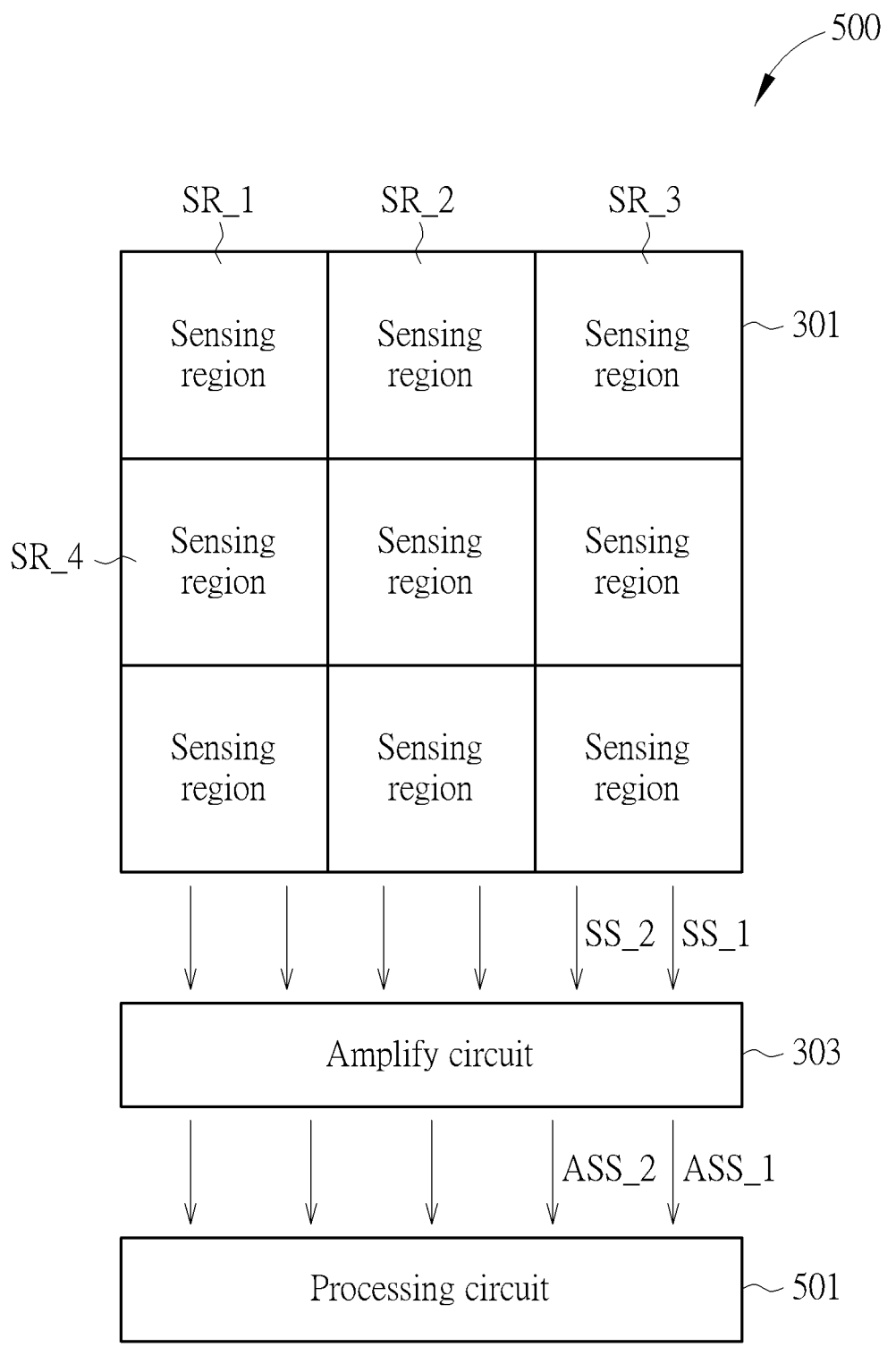
FIG. 5 is a schematic diagram illustrating a material recognition system according to one embodiment of the present invention.

FIG. 5 is a schematic diagram illustrating a material recognition system according to one embodiment of the present invention. As illustrated in FIG. 5, the material recognition system 500 comprises the image sensor 301 and the amplify circuit 303 illustrated in FIG. 3. The amplify circuit 303 amplifies the first sensing signal SS_1 and the second sensing signal SS_2 to respectively generate the first amplified sensing signal ASS_1 and the second amplified sensing signal ASS_2.

The material recognition system 500 further comprises a processing circuit 501, which is configured to determine a material type (e.g. wood, stone, metal) of the target material according to a relation between the first amplified sensing signal ASS_1 and first reference data, and a relation between the second amplified sensing signal ASS_2 and second reference data. The first kind of light and the second kind of light are from the target material. The processing circuit 501 can be, for example, implemented by a processor installer with at least one program. As above-mentioned, the amplify circuit 303 can be an ADC, thus the first amplified sensing signal SS_1 and the second amplified sensing signal SS_2 can be digital signals.

In one embodiment, the processing circuit 501 firstly calculates a first sensing ratio according to the first amplified sensing signal and a sum of the first amplified sensing signal and the second amplified sensing signal, and calculates a second sensing ratio according to the second amplified sensing signal and a sum of the second amplified sensing signal and the second amplified sensing signal. Please note, these steps are only for illustrating an example that only the first sensing region SR_1 and the second sensing region SR_2 exist. Briefly, the processing circuit 501 respectively calculates the sensing ratio for each amplified sensing signal based on the amplified sensing signal and a sum of all amplified sensing signals.

For example, as illustrated in following Table 1, the first sensing ratio is $$R(ASS\_1) = \frac{ASS\_1}{(ASS\_1 + ASS\_2 + ASS\_3 + ASS\_4)/4},$$

and the second sensing ratio is $$R(ASS\_2) \frac{ASS\_2}{(ASS\_1 + ASS\_2 + ASS\_3 + ASS\_4)/4}.$$

Such step can be called "normalize", which can change the original amplified sensing signals to a ratio that is more convenience for calculating. Please note, since the amplify circuit 303 can be an ADC thus the amplified signal can be a digital signal, the amplified signals can be regarded as a group of values, thus can be calculated.

TABLE 1

| Kind of Light | First | Second | Third | Fourth |
|---|---|---|---|---|
| Amplified sensing signal | ASS_1 | ASS_2 | ASS_3 | ASS_4 |

After calculating the sensing ratio, the following Table 2 comprising the sensing ratios can be acquired.

TABLE 2

| Kind of Light | First | Second | Third | Fourth |
|---|---|---|---|---|
| Sensing ratio | R(ASS_1) | R(ASS_2) | R(ASS_3) | R(ASS_4) |

After the sensing ratios are acquired, the processing circuit 501 calculates a cost function based on a difference between the first sensing ratio and a first reference sensing ratio and a difference between the second sensing ratio and a second reference sensing ratio. Similarly, these steps are only for illustrating an example that only the first sensing region SR_1 and the second sensing region SR_2 exist. Briefly, the processing circuit 501 respectively calculates a cost function based on differences respectively between the sensing ratio and a corresponding reference sensing ratio for each amplified sensing signal. The reference sensing ratios indicate a known material and are pre-recorded. For example, the following Table 3 indicates the sensing ratios for a known material (e.g. wood, iron, stone . . . .)

TABLE 3

| Kind of Light | First | Second | Third | Fourth |
|---|---|---|---|---|
| Reference Sensing ratio | L(ASS_1) | L(ASS_2) | L(ASS_3) | L(ASS_4) |

For the example of Table 3, the cost function can be:

Cost=|R(ASS_1)−L(ASS_1)|+|R(ASS_2)−L(ASS_2)|+|R(ASS_3)−L(ASS_3)|+|R(ASS_4)−L(ASS_4)|

The processing circuit 501 can determine the material type according to such cost function. For example, if the cost function is less than or equal to a threshold value, it mean the target material is similar with the known material or the same as the know material, thus the processing circuit 501 determines the target material is the known material if the cost function is less than or equal to a threshold value.

Please refer to FIG. 5 again, in one embodiment, the processing circuit 501 performs a weight calculation to the first amplified sensing signal ASS_1 and the second amplified sensing signal ASS_2 to generate weighted sensing signal, and determines whether the target material is a possible candidate material or not. The processing circuit only determines the material type according to the cost function when the target material is a possible candidate material. Please note, these steps are only for illustrating two sensing regions for an example that only the first sensing region SR_1 and the second sensing region SR_2 exist. Briefly, the processing circuit 501 performs a weight calculation all amplified sensing signal ASS_1 and the second amplified sensing signal ASS_2 to generate weighted sensing signal, and determines whether the target material is a possible candidate material or not.

Take Table 1 for example, the mean value of the amplified sensing signals ASS_1-ASS_4 is calculated. After that, the processing circuit 501 determines whether the mean value is in a predetermined range or not. If the mean value is in the predetermined range, it means the target material can be determined according to the recorded reference data, thus the target material is a candidate material. On the opposite, if the mean value is outside the predetermined range, it means the no reference data related with the target material is recorded, thus the target material is not a candidate material and the cost function of the target material will not be calculated. Via such step, unnecessary material recognition operation can be avoided.

Please note, the image sensor 301 in FIG. 3 is taken as an example to explain the embodiment in FIG. 5. However, the image sensor 200 can be applied to the embodiment in FIG. 5 as well. For such example, the sensing signals from the image sensor 200 are applied to determine the material type, rather than the amplified sensing signals.

Still another embodiment of the present invention discloses an image sensor, which comprises: a first sensing region having a first size; a second sensing region having a second size, the first size being different from the second size; and a cover disposed above the first sensing pixel and the second sensing pixel, the cover having a plurality of holes with different sizes, wherein one part of the holes is exposing the first sensing region and the other part of the holes is exposing the second sensing region In view above-mentioned embodiments, the light amount for the light received by different sensing regions of the image sensor can be controlled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A material recognition system, comprising:
an image sensor, comprising:
a first sensing region, configured to sense first kind of light having a first range of wavelengths, and configured to generate first sensing units based on the first kind of light; and
a second sensing region, configured to sense second kind of light having a second range of wavelengths, and configured to generate second sensing units based on the second kind of light, wherein at least portion of the first range of wavelengths and at least portion of the second range of wavelengths are different; and
an amplify circuit, configured to apply a first gain value to amplify a first sensing signal formed by the first sensing units to generate a first amplified sensing signal, and configured to apply a second gain value to amplify a second sensing signal formed by the second sensing units to generate a second amplified sensing signal, wherein the first gain value and the second gain value are different;
wherein the image sensor has a first light sensitivity level for sensing the first kind of light and has a second light sensitivity level for sensing the second kind of light, and a relation between the first gain value and the second gain value corresponds to a relation between the first light sensitivity level and the second light sensitivity level;
wherein the first kind of light and the second kind of light are from a target material and the material recognition system further comprises:
a processing circuit, configured to determine a material type of the target material according to a relation between the first amplified sensing signal and a first reference data, and a relation between the second amplified sensing signal and a second reference data.

2. The material recognition system of claim 1, wherein the step of determine a material type of the target material comprises:
calculating a first sensing ratio according to the first amplified sensing signal and a sum of the first amplified sensing signal and the second amplified sensing signal;
calculating a second sensing ratio according to the second amplified sensing signal and a sum of the first amplified sensing signal and the second amplified sensing signal;
calculating a cost function based on a difference between the first sensing ratio and a first reference sensing ratio and a difference between the second sensing ratio and a second reference sensing ratio; and
determining the material type according to the cost function.

3. The material recognition system of claim 2, wherein the processing circuit is further configured to perform steps of:
performing a weight calculation to the first amplified sensing signal and the second amplified sensing signal to generate weighted sensing signal;
determining whether the target material is a possible candidate material or not;
wherein the processing circuit only determines the material type according to the cost function when the target material is a possible candidate material.

4. The material recognition system of claim 1, wherein a first size of the first sensing region and a second size of the second sensing region are the same.

* * * * *